(12) United States Patent
Parkhe (10) Patent No.: US 9,666,467 B2
(45) Date of Patent: May 30, 2017

(54) DETACHABLE HIGH-TEMPERATURE ELECTROSTATIC CHUCK ASSEMBLY

(71) Applicant: Varian Semiconductor Equipment Associates, Inc., Gloucester, MA (US)

(72) Inventor: Vijay D. Parkhe, San Jose, CA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 204 days.

(21) Appl. No.: 14/549,843

(22) Filed: Nov. 21, 2014

(65) Prior Publication Data

US 2016/0148828 A1 May 26, 2016

(51) Int. Cl.
*H01L 21/687* (2006.01)
*H01L 21/683* (2006.01)
*H02N 13/00* (2006.01)
*H01L 21/67* (2006.01)

(52) U.S. Cl.
CPC .... *H01L 21/6833* (2013.01); *H01L 21/67109* (2013.01); *H01L 21/67126* (2013.01); *H01L 21/68742* (2013.01); *H01L 21/68785* (2013.01); *H02N 13/00* (2013.01)

(58) Field of Classification Search
CPC .......... H01L 21/6833; H01L 21/68742; H01L 21/67126; H01L 21/67109; H01L 21/68785
See application file for complete search history.

(56) References Cited

U.S. PATENT DOCUMENTS

| 5,310,453 | A | * | 5/1994 | Fukasawa | ........... H01L 21/6833 438/716 |
|---|---|---|---|---|---|
| 5,491,603 | A | * | 2/1996 | Birang | ................ H01L 21/6833 361/234 |
| 5,796,074 | A | * | 8/1998 | Edelstein | ............ C23C 16/4586 219/390 |
| 2009/0014323 | A1 | * | 1/2009 | Yendler | ................... H01J 37/20 204/298.33 |
| 2009/0236949 | A1 | * | 9/2009 | Fujii | ..................... C23C 14/088 310/367 |
| 2012/0200980 | A1 | * | 8/2012 | Blake | ................. H01L 21/6831 361/212 |

\* cited by examiner

*Primary Examiner* — Thienvu Tran
*Assistant Examiner* — Tien Mai (57) ABSTRACT

A detachable high-temperature electrostatic chuck assembly including a chuck body for supporting a substrate, an interface plate coupled to the chuck body by a sealing ring, the sealing ring defining a pocket between the chuck body and the interface plate that is sealed from a surrounding vacuum environment, and a cooling plate disposed between the chuck body and the interface plate. An interface between the chuck body and the cooling plate is located within the pocket.

21 Claims, 11 Drawing Sheets

DETACHABLE HIGH-TEMPERATURE ELECTROSTATIC CHUCK ASSEMBLY

FIELD OF THE DISCLOSURE

Embodiments of the present disclosure relate to the field of semiconductor and solar cell processing, and more particularly to an electrostatic chuck assembly suitable for use in high temperature processes.

BACKGROUND OF THE DISCLOSURE

Electrostatic chucks are commonly used to hold substrates, such as semiconductor wafers, during various manufacturing processes. Such processes include, but are not limited to, ion implantation, physical vapor deposition, chemical vapor deposition, and etching. Electrostatic chucks typically include one or more electrodes embedded within a chuck body, sometimes referred to as a "puck," which is typically formed at least partly of a dielectric or semiconductive ceramic material across which an electrostatic clamping field can be generated. The electrostatic clamping field can securely hold a substrate to a face of the chuck body without the aid of mechanical retention mechanisms.

Electrostatic chucks offer several advantages relative to mechanical clamping devices and vacuum chucks. For example, electrostatic chucks mitigate the occurrence of stress-induced cracks in substrates which can occur when mechanical clamping devices are employed. Additionally, electrostatic chucks allow larger areas of substrates to be exposed for processing with little or no edge exclusion. Still further, electrostatic chucks are able to hold substrates against chucking surfaces with more uniform pressure distribution relative to other chucking means, thereby facilitating greater control over substrate temperatures when substrate heating and/or cooling devices are employed. Electrostatic chucks can also be effectively employed in low pressure or high vacuum environments.

Various processes that are performed on substrates, such as during the fabrication of integrated circuits, involve subjecting substrates to temperatures in excess of 200 degrees Celsius, and often up to about 450 degrees Celsius (C). However, conventional electrostatic chucks are generally only capable of operating up to a temperature of about 120 degrees C. When exposed to temperatures above about 120 degrees C., the components of many conventional electrostatic chucks will begin to fail. It would therefore be advantageous to provide an electrostatic chuck that is capable of operating at temperatures up to, an in excess of, about 450 degrees C. without experiencing heat-induced component failure.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

An exemplary embodiment of a high-temperature electrostatic chuck assembly in accordance with the present disclosure may include a chuck body for supporting a substrate, an interface plate coupled to the chuck body by a sealing ring, the sealing ring defining an enclosed volume between the chuck body and the interface plate, a cooling plate disposed between the chuck body and the interface plate, wherein an interface between the chuck body and the cooling plate is located within the enclosed volume, and a lift pin assembly including a lift pin bellows extending through the enclosed volume between the interface plate and a lift pin aperture in the chuck body, and an axially displaceable lift pin disposed within the lift pin bellows, wherein an internal volume of the lift pin bellows is fluidically sealed from the enclosed volume.

Another exemplary embodiment of a high-temperature electrostatic chuck assembly in accordance with the present disclosure may include a chuck body for supporting a substrate, an interface plate coupled to the chuck body by a sealing ring, the sealing ring defining an enclosed volume between the chuck body and the interface plate, a cooling plate disposed between the chuck body and the interface plate, wherein an interface between the chuck body and the cooling plate is located within the enclosed volume, and a backside gas assembly including a backside gas bellows extending through the enclosed volume between a backside gas supply line and a backside gas outlet in the chuck body, wherein an internal volume of the backside gas bellows is fluidically sealed from the enclosed volume.

Another exemplary embodiment of a high-temperature electrostatic chuck assembly in accordance with the present disclosure may include a chuck body for supporting a substrate, an interface plate coupled to the chuck body by a sealing ring, the sealing ring defining an enclosed volume between the chuck body and the interface plate, a cooling plate disposed between the chuck body and the interface plate, wherein an interface between the chuck body and the cooling plate is located within the enclosed volume, a lift pin assembly including a lift pin bellows extending through the cooling plate between the interface plate and a lift pin aperture in the chuck body, and further including an axially displaceable lift pin disposed within the lift pin bellows, wherein an internal volume of the lift pin bellows is fluidically sealed from the enclosed volume, and a backside gas assembly including a backside gas bellows extending through the cooling plate between a backside gas supply line and a backside gas outlet in the chuck body, wherein an internal volume of the backside gas bellows is fluidically sealed from the enclosed volume.

BRIEF DESCRIPTION OF THE DRAWINGS

By way of example, various embodiments of the disclosed device will now be described, with reference to the accompanying drawings, in which.

DETAILED DESCRIPTION

An apparatus in accordance with the present disclosure will now be described more fully hereinafter with reference to the accompanying drawings, in which preferred embodiments of the apparatus are shown. The apparatus, however, may be embodied in many different forms and should not be construed as being limited to the embodiments set forth herein. Rather, these embodiments are provided so that this disclosure will be thorough and complete, and will fully convey the scope of the apparatus to those skilled in the art. In the drawings, like numbers refer to like elements throughout unless otherwise noted.

Figure 1:
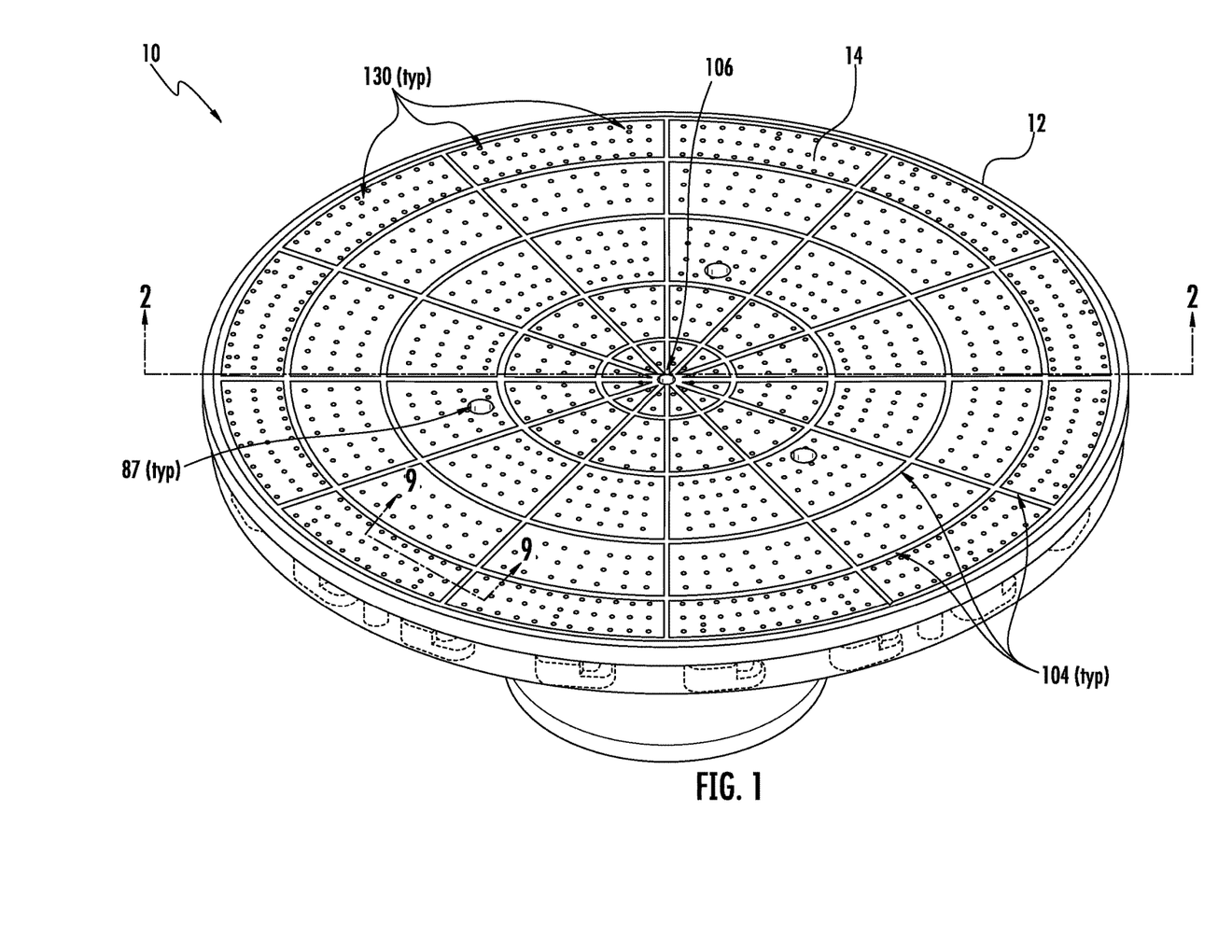
FIG. 1 is a top perspective view of an exemplary embodiment of a detachable high-temperature electrostatic chuck assembly in accordance with the present disclosure.

In accordance with an exemplary embodiment of the present disclosure, a high-temperature electrostatic chuck assembly 10 (hereinafter "the assembly 10") is shown in FIG. 1. For the sake of convenience and clarity, terms such as "top," "bottom," "upper," "lower," "vertical," "horizontal," "lateral," "longitudinal," "radial," "inner," and "outer" may be used herein to describe the relative placement and orientation of the features and components of the assembly 10, each with respect to the geometry and orientation of the assembly 10 as it appears in the perspective view shown in FIG. 1 as well as in the cross-sectional view shown in FIG. 2. Said terminology will include the words specifically mentioned, derivatives thereof, and words of similar import.

Referring to FIG. 1, the assembly 10 may include a chuck body or "puck" 12 having an uppermost chucking surface 14 adapted to support a substrate (not shown). The chuck body 12 may be formed of a plurality of substantially planar, circular layers 16, 18, 20, 22 (shown in FIG. 3) that may be bonded to one another (e.g., by sintering) in a flatly abutting, stacked arrangement to define the disc-shaped chuck body 12. The layers 16-22 may be formed of ceramic or any other dielectric or semi-conductive material that is capable of withstanding operational temperatures in excess of 450 degrees C. A suitable, non-limiting example of such a material is aluminum nitride (AlN). It is contemplated that all of the layers may 16-22 be formed of the same material, or that one or more of the layers 16-22 may be formed a different material. While the chuck body 12 of the exemplary embodiment includes a total of four layers 16-22, it is contemplated that the chuck body 12 may be formed of a greater or fewer number of layers without departing from the scope of the present disclosure.

The multi-layer construction of the chuck body 12 may allow numerous circuits to be embedded within the chuck body 12 to facilitate a variety of functions. For example, a heater circuit 24 (FIG. 3) may be sandwiched between the layers 16, 18 and may, upon the application of electrical current thereto, radiate heat throughout the chuck body 12. Additionally, a grounding circuit 26 may be sandwiched between the layers 18, 20 and may be electrically coupled to ground pins of the assembly 10 (as further described below) for dissipating electrical charge from a substrate supported by the chuck body 12. Still further, a chucking electrode circuit 28 may be sandwiched between the layers 20, 22 and may be coupled to a chucking power source (not shown) for controllably generating an electrostatic clamping field for securely holding a substrate to the chucking surface 14 of the chuck body 12. In one non-limiting example, each of the heater circuit 24, the grounding circuit 26, and the chucking electrode circuit 28 may include a plurality of interconnected, conductive traces, vias, or the like that may be screen printed or otherwise formed on the surfaces of the layers 16-22, respectively, prior to bonding the layers 16-22 together to form the chuck body 12.

Figure 2:
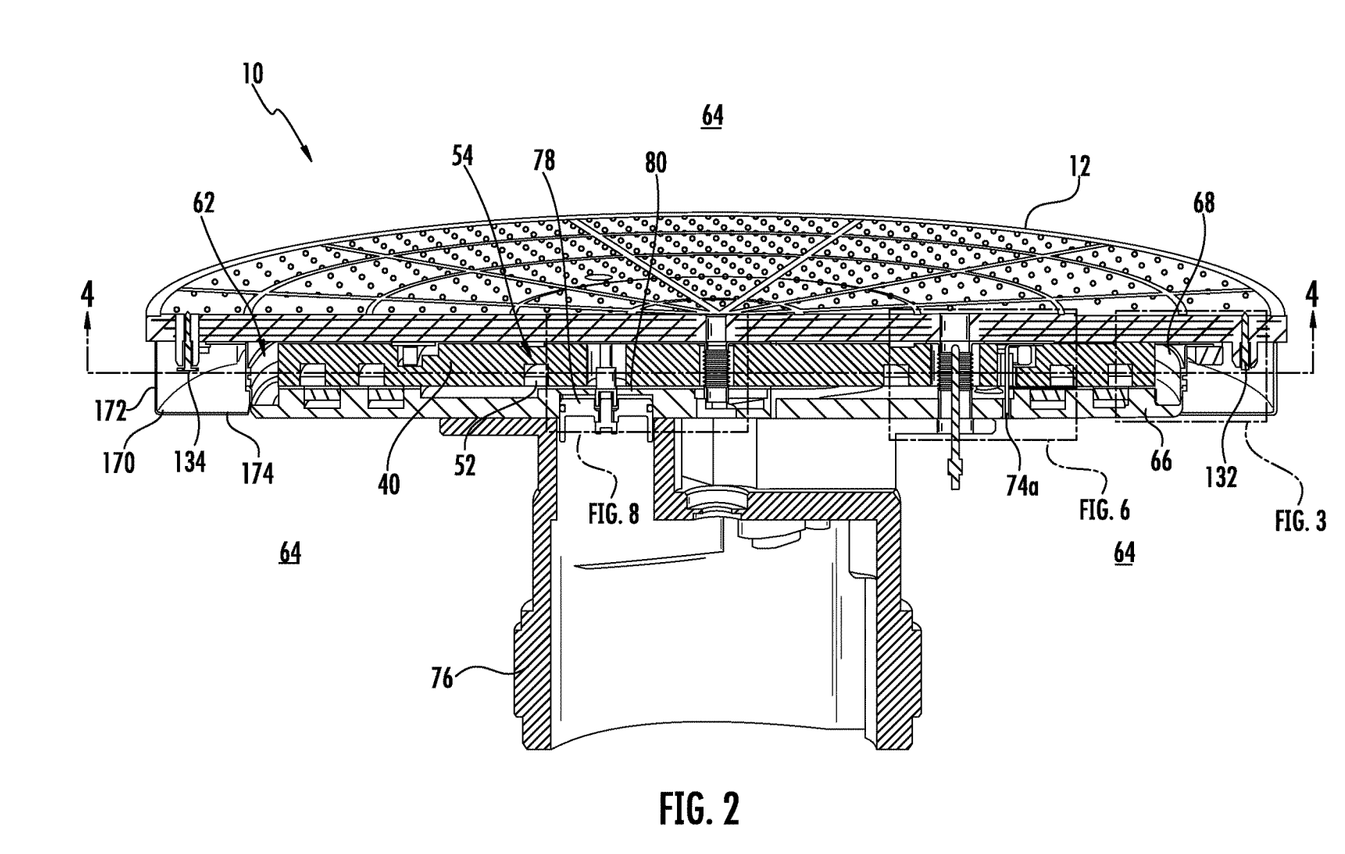
FIG. 2 is a cross-sectional view of the exemplary detachable high-temperature electrostatic chuck assembly of the present disclosure taken along the line A-A in FIG. 1.
Figure 4:
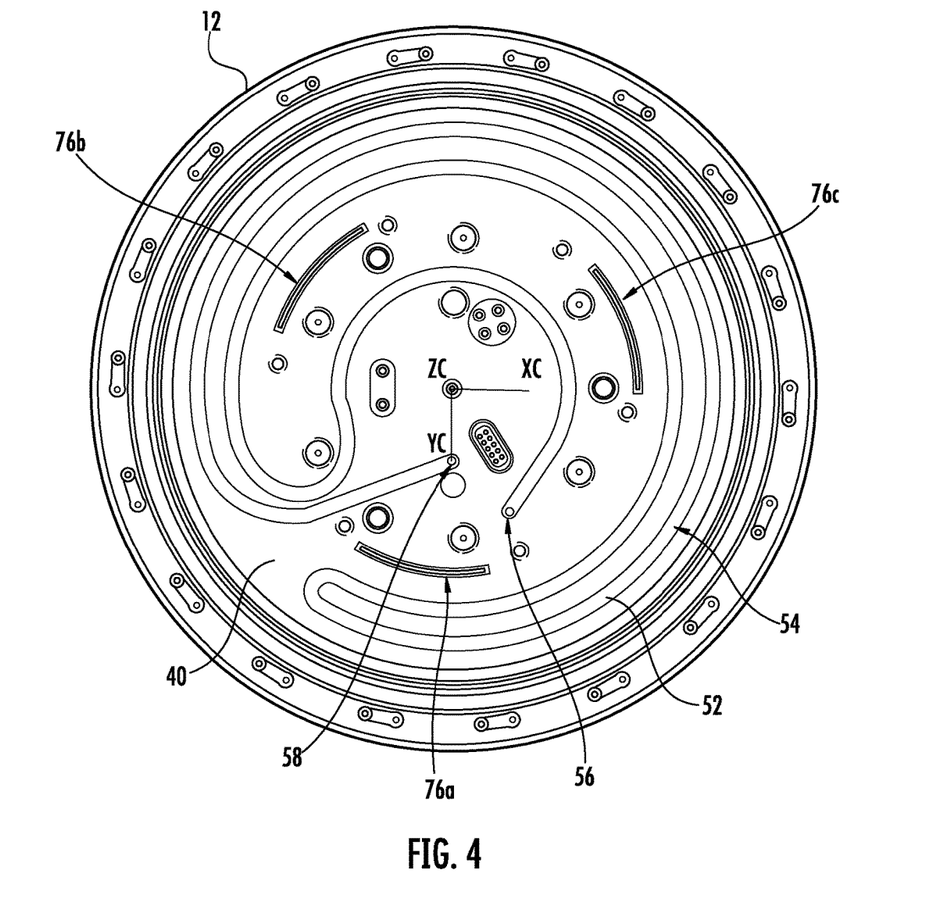
FIG. 4 is a cross-sectional view of the cooling plate of the exemplary detachable high-temperature electrostatic chuck assembly of the present disclosure taken along the line B-B in FIG. 2.

Referring to the cross-sectional view of the assembly 10 shown in FIG. 2, the assembly 10 may further include a cooling plate 40. The cooling plate 40 may be a substantially disc-shaped member disposed below, and in flat abutment with, the chuck body 12. The cooling plate 40 may be formed of a durable, thermally-conductive metal or composite material, examples of which include, but are not limited to, aluminum, copper, stainless steel, molybdenum, and aluminum-silicon alloy. A serpentine-shaped fluid conduit 52 (shown in greater detail in FIG. 4) may be disposed within a similarly shaped channel 54 in the bottom of the cooling plate 40 and may be adapted to circulate water or another cooling fluid through the cooling plate 40. As shown in FIG. 4, the fluid conduit 52 may be provided with a fluid inlet port 56 through which cooling fluid may be supplied from an external cooling fluid source and a fluid outlet port 58 through which the cooling fluid may exit the fluid conduit 52. The cooling fluid may be circulated by a pump (not shown) that may be external to the assembly 10. The circulating cooling fluid, which may be introduced into the fluid conduit 52 at a desired temperature, may continuously draw heat from the cooling plate 40 and the chuck body 12, and may thereby prevent the chuck body 12 from exceeding a predetermined maximum temperature. In one non-limiting exemplary embodiment the predetermined maximum temperature may be about 450 degrees C., and the circulating cooling fluid may be introduced into the fluid conduit 52 at a temperature of about 80 degrees C.

The amount of heat removed from the chuck body 12 by the cooling plate 40 can depend on various factors, such as the size and shape of the fluid conduit 52, the rate at which cooling fluid is circulated through the fluid conduit 52, the temperature of the cooling fluid when it enters the fluid conduit 52, and the thickness of the cooling plate 40, all of which can be varied as desired without departing from the scope of the present disclosure. Embodiments of the assembly 10 are contemplated in which the temperature of the chuck body 12 is continuously monitored during operation, such as by one or more resistance temperature detectors (RTDs) or thermocouples (not shown) embedded within the chuck body 12 or the cooling plate 40. As will be appreciated, the temperature and/or the flow rate of the cooling fluid can be controllably varied to keep the temperature of the chuck body 12 within a predetermined range or below a predetermined maximum temperature, as measured by the one or more RTDs or thermocouples.

Referring again to FIG. 3, a heat transfer layer 60 formed of a material having desired heat transfer properties may be disposed intermediate the cooling plate 40 and the chuck body 12 for controlling heat transfer there between. Non-limiting examples of such materials include, but are not limited to, polymers such as a perfluoroelastomer (e.g., KALREZ®), and temperature-resistant, flexible graphite materials such as GRAPHOIL. Particularly, KALREZ® may be suitable for applications in which the heat transfer layer 60 may reach temperatures of up to about 325 degrees C., and GRAPHOIL may be suitable for applications in which the heat transfer layer 60 may reach temperatures exceeding 325 degrees C. which may melt KALREZ®. Alternative, embodiments of the assembly 10 are contemplated in which multiple heat transfer layers are disposed between cooling plate 40 and the chuck body 12 in a stacked arrangement, wherein one of the heat transfer layers may be formed of a polymer such as perfluoroelastomer (e.g., KALREZ®) and another of the heat transfer layers may be formed of a non-reactive, temperature-resistant material such as GRAPHOIL. In some embodiments of the assembly 10, the heat transfer layer 60 may be vulcanized to the cooling plate 40 to improve contact therewith.

In order to achieve sufficient heat transfer between the chuck body 12 and the cooling plate 40 to provide adequate cooling for high-temperature applications in which the chuck body 12 may be heated to temperatures approaching or exceeding 450 degrees C., the interface of the chuck body 12 and the cooling plate 40 may be disposed within an enclosed volume or pocket 62 (shown in FIGS. 2 and 3) within the assembly 10. In some embodiments this pocket can be sealed from the vacuum environment 64 surrounding the assembly 10. The pocket 62 may be maintained at or near atmospheric pressure, while the vacuum environment 64 may be a substantially particle-free, substrate processing environment that is held at or near vacuum pressure using turbomolecular pumps, cryogenic pumps or the like (not shown). Separation of the pocket 62 within the assembly 10 from the vacuum environment 64 outside of the assembly 10 may be achieved through the cooperation of several structural features of the assembly 10. These structural features will now be described in detail.

Referring to FIG. 2, the assembly 10 may include an interface plate 66. The interface plate 66 may be a substantially disc-shaped member that may be disposed below, and in flat abutment with, the cooling plate 40. The interface plate 66 may be formed of a durable, corrosion-resistant material, a non-limiting example of which is stainless steel.

The interface plate 66 may be coupled to the chuck body 12 by an annular sealing ring 68 (shown in detail in FIG. 5) that radially surrounds the cooling plate 40. The sealing ring 68 may be formed of a temperature-resistant material having a coefficient of thermal expansion that facilitates coupling of the metal interface plate 66 to the ceramic chuck body 12 without imparting excessive mechanical stress on the chuck body 12 during thermal expansion and contraction of the chuck body 12, the sealing ring 68, and/or the interface plate 66. A non-limiting example of such a material is an iron-nickel-cobalt alloy (e.g., KOVAR®).

Figure 3:
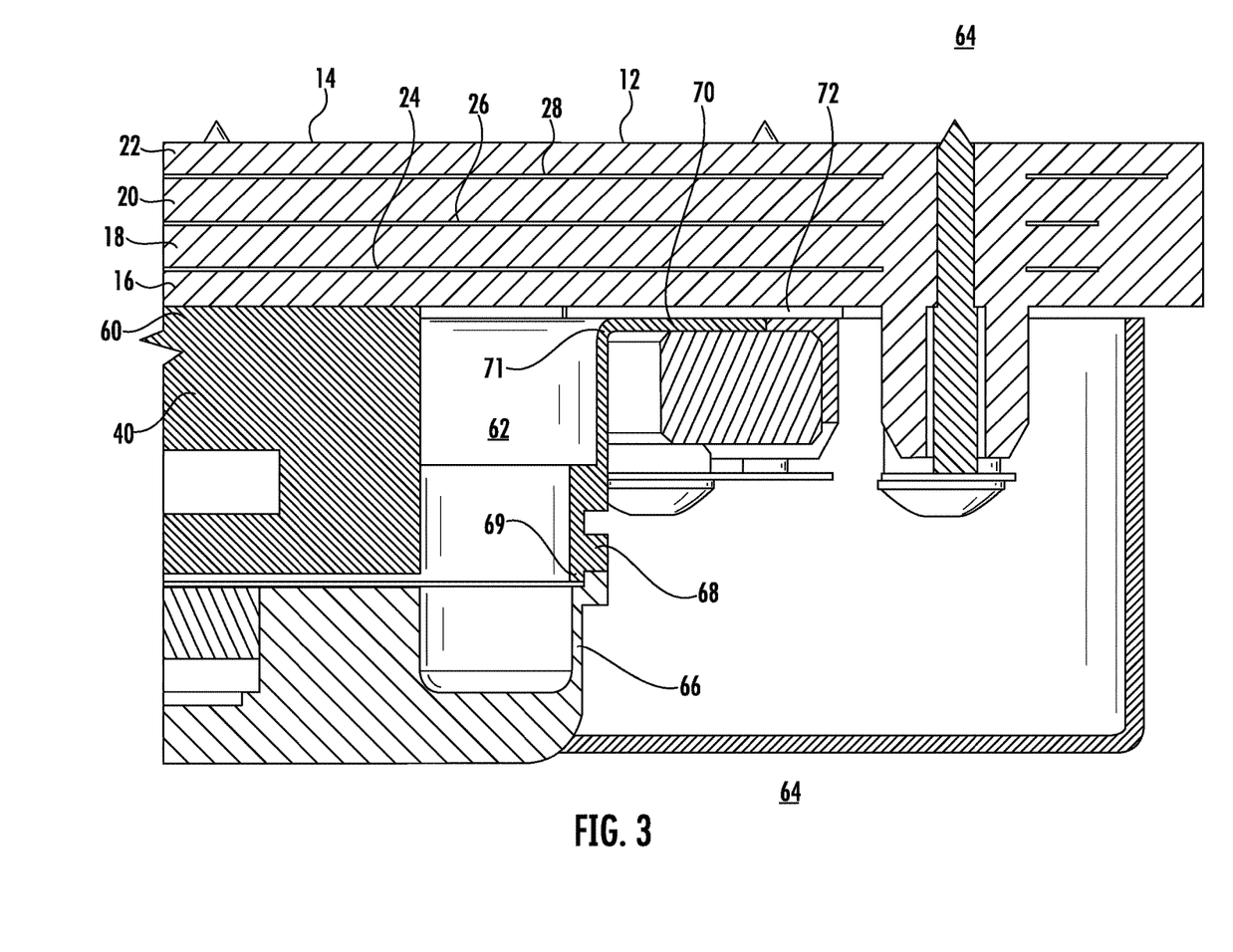
FIG. 3 is a detail cross-sectional view illustrating an outer sealing ring and surrounding components of the detachable high-temperature electrostatic chuck assembly shown in FIG. 2.

Referring to the detail view of the chuck body 12, the cooling plate 40, the sealing ring 68, and the interface plate 66 shown in FIG. 3, a bottom circumferential edge, rim or portion 69 of the sealing ring 68 may be welded or otherwise coupled to the interface plate 66 in a manner that establishes an annular, fluid-tight seal between the sealing ring 68 and the interface plate 66. Similarly, a top edge, rim, or portion 71 of the sealing ring 68 may be coupled to the chuck body 12 in a manner that establishes an annular, fluid-tight seal between the sealing ring 68 and the chuck body 12. If the chuck body 12 is formed of ceramic or another non-metallic material, it may not be possible to weld the sealing ring 68 directly to the chuck body 12. Thus, in the exemplary embodiment shown in FIG. 3, the top portion 71 of the sealing ring 68 may be provided with a radially outwardly-extending annular flange 70, which itself may be weldable. The flange 70 may be welded to a substantially planar, annular metal plate 72, which in-turn may be brazed to the chuck body 12 in a flatly abutting relationship therewith. Alternatively, if the chuck body 12 is formed of a material that is amenable to welding, it is contemplated that the metal plate 72 may be omitted and that the sealing ring 68 may be coupled directly to the chuck body 12.

With the chuck body 12 coupled to the interface plate 66 by the sealing ring 68 in the above-described manner, the sealing ring may provide a primary, fluid-tight barrier for sealing the pocket 62 within the assembly 10 from the vacuum environment 64 surrounding the assembly 10.

Figure 5:
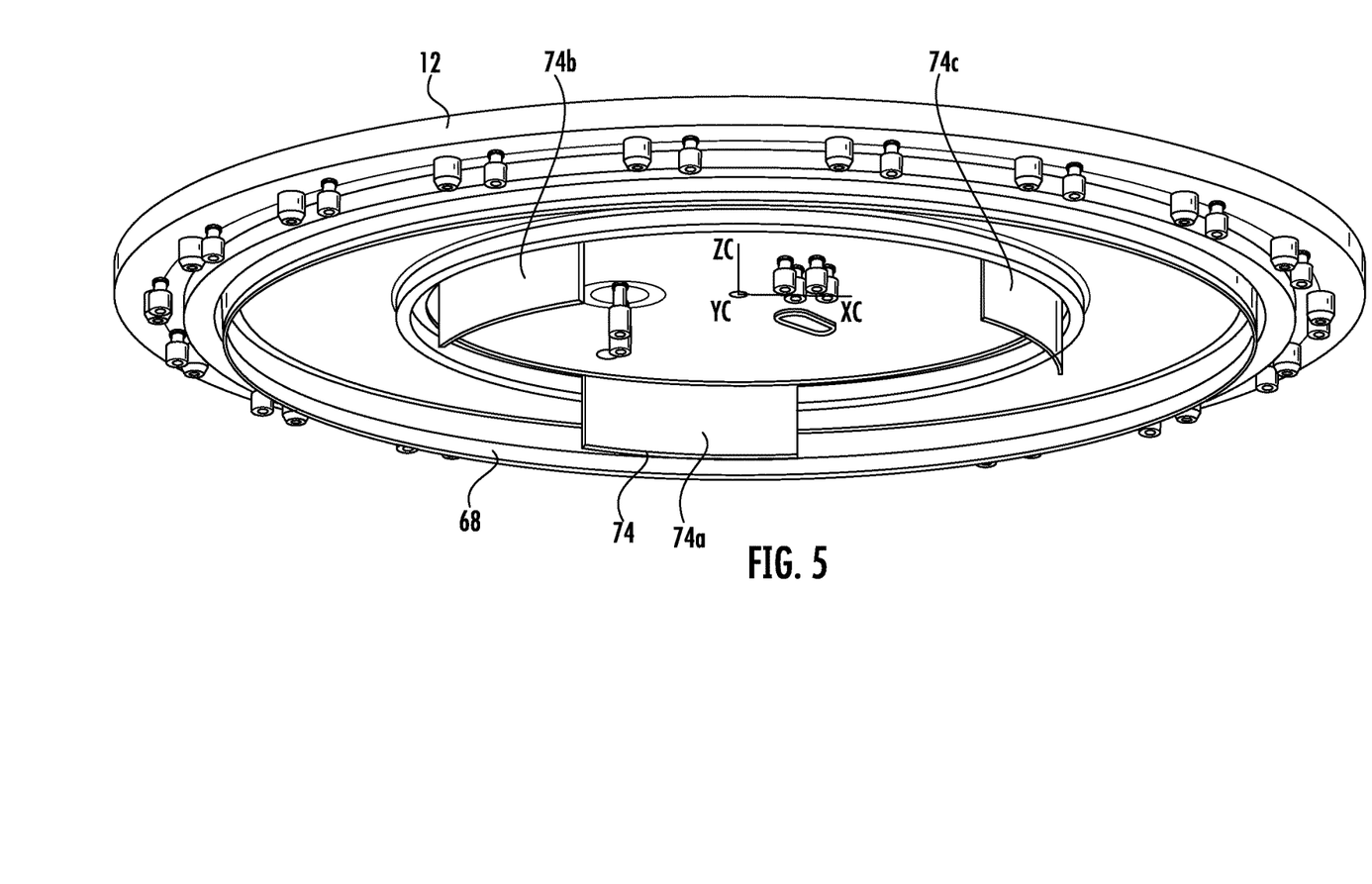
FIG. 5 is a perspective bottom view illustrating portions of the exemplary detachable high-temperature electrostatic chuck assembly of the present disclosure.

Referring now to FIGS. 2 and 5, the assembly 10 may further include a supporting ring 74 that may be defined by a plurality of discrete, segments 74a, 74b, 74c. In the exemplary embodiment of the present disclosure, the segments 74a, 74b, 74c may be curvilinear segments. The curvilinear segments 74a, 74b, 74c may extend vertically between the interface plate 66 and the chuck body 12 and may be positioned in regular spaced apart relation around the circumference of the supporting ring 74. The curvilinear segments 74a, 74b, 74c may extend through corresponding curvilinear slots 76a, 76b, 76c formed in the cooling plate 40 (best shown in FIG. 4). Like the sealing ring 68, the supporting ring 74 may be formed of KOVAR® or another rigid, temperature-resistant material having a coefficient of thermal expansion that facilitates coupling of the metal interface plate 66 to the ceramic chuck body 12 without imparting excessive mechanical stress on the chuck body 12 during thermal expansion and contraction of the chuck body 12, the supporting ring 74, and/or the interface plate 66.

Figure 6:
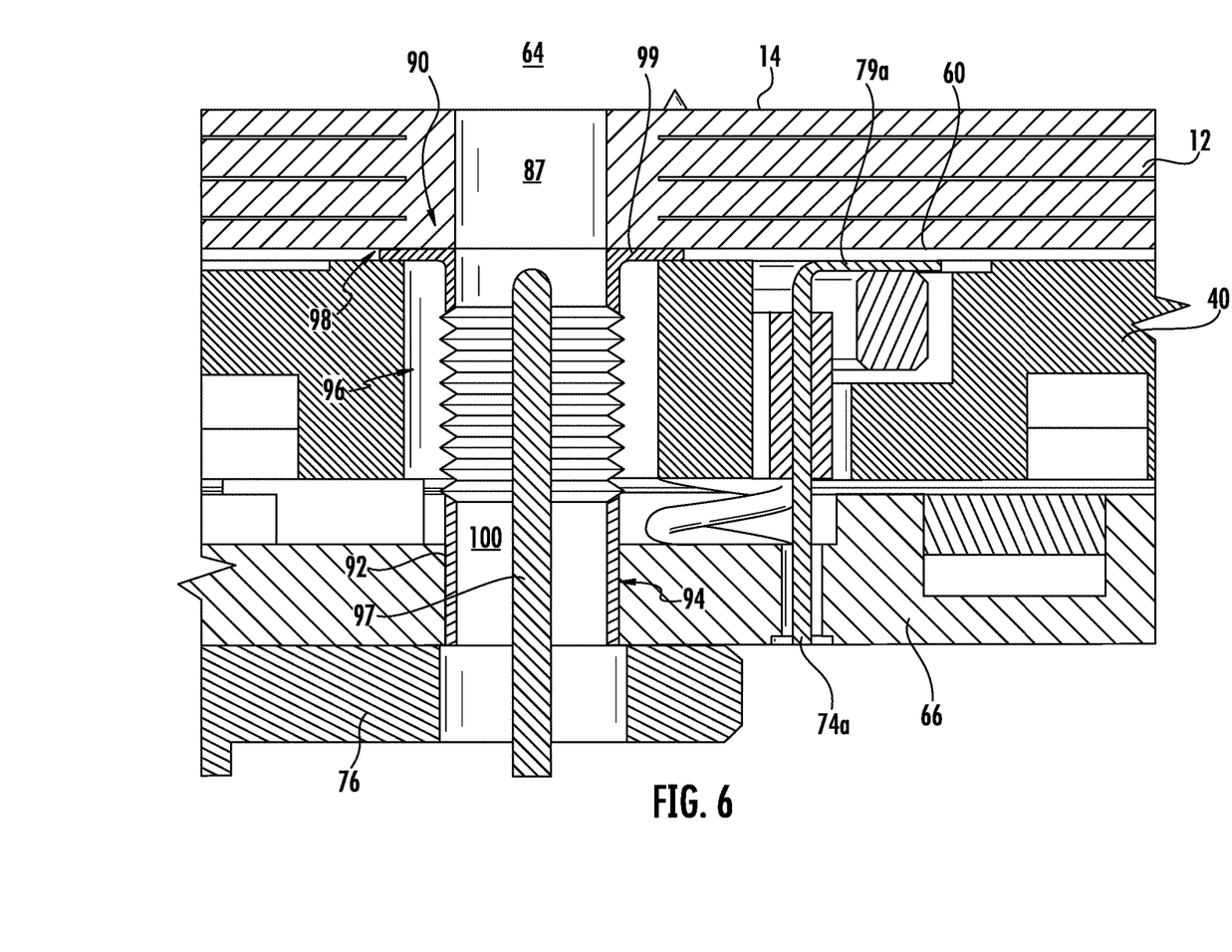
FIG. 6 is a detail cross-sectional view illustrating a lift pin assembly and surrounding components of the exemplary detachable high-temperature electrostatic chuck assembly shown in FIG. 2.

Referring to FIG. 6, a detail cross-sectional view of the curvilinear segment 74a of the supporting ring 74 is shown. The curvilinear segment 74a may be substantially identical to the segments 74b, 74c shown in FIG. 5. It will be therefore be understood that the following description of the curvilinear segment 74a shall also apply to the curvilinear segments 74b, 74c.

A bottom edge or portion of the curvilinear segment 74a may be welded or otherwise coupled to the interface plate 66. A top edge or portion of the curvilinear segment 74a may be disposed in direct or indirect supportive abutment with the chuck body 12. In the illustrated embodiment, a top edge or portion of the curvilinear segment 74a may comprise a radially outwardly-extending annular flange 79a that is positioned immediately below the heat transfer layer 60 in non-attached, flat abutment therewith. The curvilinear segment 74a may thereby limit vertical movement of the heat transfer layer 60 and the abutting chuck body 12 relative to the interface plate 66. Alternative embodiments of the assembly 10 are contemplated in which the top edge or portion of the curvilinear segment 74a may be coupled to the chuck body 12 and/or to the heat transfer layer 60, such as by welding, brazing, or with one or more mechanical fasteners or adhesives.

With the supporting ring 74 disposed intermediate the interface plate 66 and the chuck body 12 in the above-described manner, the chuck body 12 may be supported against excessive vertical movement relative to the interface plate 66. This may reduce deformational stresses in the chuck body 12 that might otherwise result from atmospheric pressure within the pocket 62. The supporting ring 74 may also ensure uniform spacing between the chuck body 12 and the cooling plate 40, which may in turn help maintain temperature uniformity across the chuck body 12 during operation.

While the supporting ring 74 of the exemplary embodiment has been shown and described as including three curvilinear segments 74a, 74b, 74c, it is contemplated that the supporting ring 74 can be implemented with a greater or fewer number of segments without departing from the present disclosure. It is further contemplated that various other supportive structures, including columns, posts, blocks, mesas, and the like, may be implemented in addition, or in alternative to the supporting ring 74 for supporting the chuck body 12 in a similar manner without departing from the scope of the present disclosure. All such structural variations are encompassed herein by the generic term "supporting ring," including those structures that are not rings and that do not include ring-like features.

Referring again to FIG. 2, the interface plate 66 of the assembly 10 may be removably coupled to an adapter plate 76. The adapter plate 76 may be configured to mechanically couple the assembly 10 to a drive mechanism (not shown) that is configured to move (e.g., rotate, tilt, vertically and/or horizontally shift, etc.) the assembly 10 in a controllable manner. The adapter plate 76 may also facilitate routing and/or coupling of external resources to various components of the assembly 10 via various fluidically sealed connections (described in greater detail below) between the interface plate 66 and the adapter plate 76.

Figure 7:
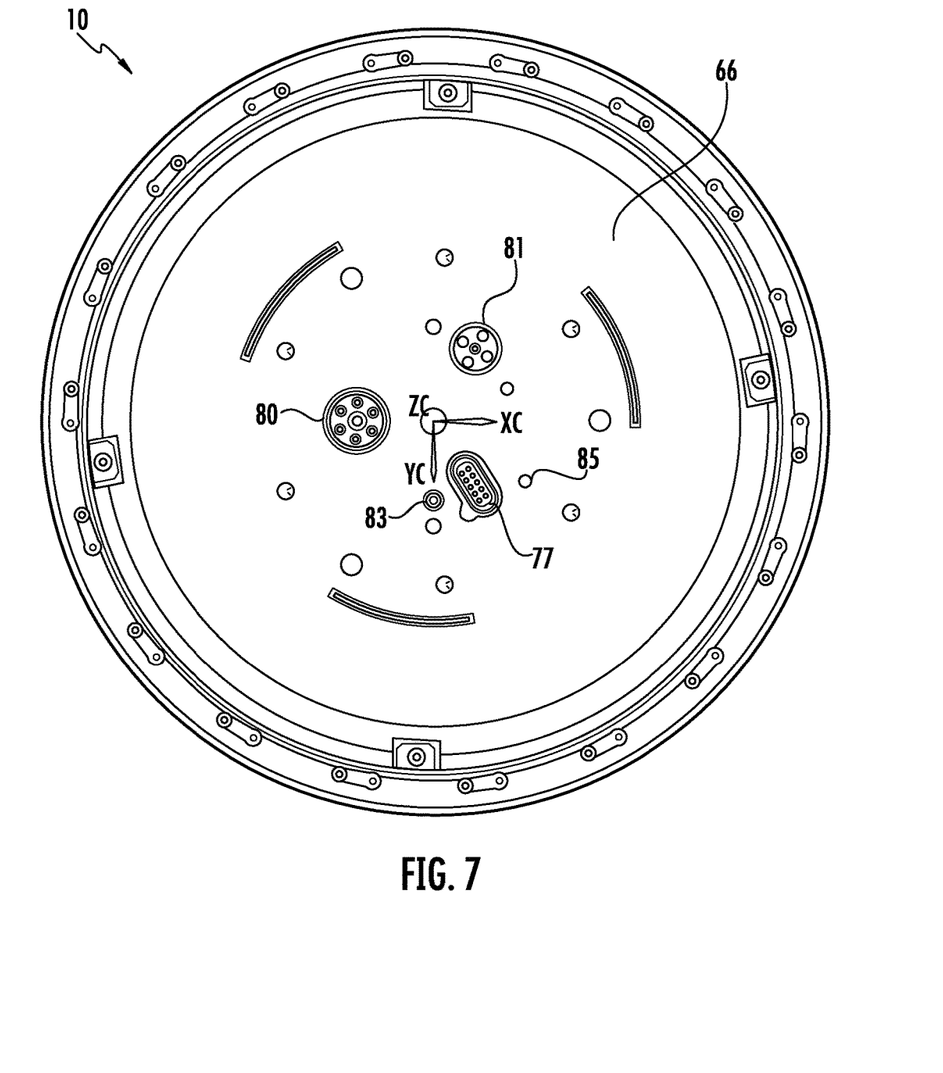
FIG. 7 is a bottom view illustrating the exemplary high-temperature electrostatic chuck assembly of the present disclosure.

Referring to the bottom view of the assembly 10 shown in FIG. 7, the interface plate 66 may include a number of connectors that are adapted to establish fluidically sealed connections between the interface plate 66 and the adapter plate 76 when they are coupled to corresponding connectors on the adapter plate 76. For example, the interface plate 66 may include a high voltage socket 80, shown in detail in FIG. 8, which matingly engages a high voltage connecter 78 on the adapter plate 76. The high voltage connecter 78 and high voltage socket 80 may supply electrical power from an external electrical power source (not shown) to the chucking electrode circuit 28 of the chuck body 12, such as through an insulated conductor 82 that extends from the high voltage socket 80 through a corresponding aperture 84 in the cooling plate 40. The high voltage socket 80 may be provided with an annular sealing ring 86 (e.g., gasket, o-ring or the like) that may establish a fluid-tight seal when the high voltage connecter 78 is plugged into the high voltage socket 80, thereby sealing the pocket 62 within the assembly 10 from the vacuum environment 64 outside of the assembly 10.

In addition to the high voltage socket 80, the interface plate 66 may include a number of other connectors that are adapted to establish fluidically sealed connections between the interface plate 66 and the adapter plate 76 when they are coupled to corresponding connectors on the adapter plate 76. For example, referring again to FIG. 7, the interface plate 66 may be provided with a resistance temperature detector (RTD) connection socket 77, a heater terminal connection socket 81, a water supply-in connection socket 83, and a water supply out connection socket 85, all of which may be provided with respective sealing structures (e.g., gaskets, O-rings or the like) for establishing fluid-tight connections when the RTD connection socket 77, heater terminal connection socket 81, water supply-in connection socket 83, and water supply-out connection socket 85 are coupled to corresponding connectors on the adapter plate 76. Thus, the assembly 10 may be removably coupled to the adapter plate 76 in a manner that connects and/or supplies external resources (e.g., heat transfer gas, cooling fluid, grounding connections, sensor connections, various other electrical connections, etc.) to components of the assembly 10 while preventing exposure of the sealed pocket 62 to the vacuum environment 64. All such fluid-tight connections may be established by simply mounting the assembly 10 to the adapter plate. No external sealing structures or devices are necessary.

Referring again to FIG. 1, the chuck body 12 of the assembly may further be provided with a plurality of lift pin apertures 87 for allowing vertical pass-through of corresponding lift pins (described below) that may be employed for raising and lowering a substrate relative to the chucking surface 14, such as during loading and unloading of a substrate onto and off of the chuck body 12. The chuck body 12 is shown as having a total of three lift pin apertures 87 for accommodating three respective lift pins, though it is contemplated that the chuck body 12 may include additional lift pin apertures 87 for accommodating additional respective lift pins without departing from the present disclosure.

Referring back to FIG. 6, a detail cross-sectional view of a lift pin assembly 90 of the assembly 10 is shown. Though only one lift pin assembly 90 is visible in the provided figures, it will be understood that the assembly 10 includes other, substantially identical lift pin assemblies located below each of the lift pin apertures 87 shown in FIG. 1. The following description of the lift pin assembly 90 shall therefore also apply to each of the other lift pin assemblies of the assembly 10.

The lift pin assembly 90 may include a tubular lift pin bellows 92 that may extend vertically between the adapter plate 76 and the chuck body 12 through respective apertures 94, 96, 98 in the interface plate 66, the cooling plate 40, and the heat transfer layer 60, respectively. In one non-limiting example, the lift pin bellows 92 may be formed of stainless steel. A lower portion or edge of the lift pin bellows 92 may be welded or otherwise coupled to the interface plate 66 and/or the adapter plate 76 in a manner that forms a fluid-tight seal there between. A top edge or portion of the lift pin bellows 92 may be coupled to the chuck body 12 in a manner that forms a fluid-tight seal there between, and with the lift pin bellows 92 disposed in a substantially coaxial relationship with the lift pin aperture 87 in the chuck body 12. In the non-limiting example shown in FIG. 6, the top of the lift pin bellows 92 may be provided with a radially outwardly-extending annular flange 99. The flange 99 may be brazed to the chuck body 12 in a flatly abutting relationship therewith, and may radially surround the lower terminus of the lift pin aperture 87. The lift pin bellows 92 may be capable of axially extending and retracting to accommodate vertical movement of the chuck body 12 relative to the interface plate 66, such as may occur when substrates are loaded and unloaded from the chucking surface 14, while maintaining fluid tight coupling between the interface plate 66 and the chuck body 12.

The lift pin assembly 90 may further include a vertically oriented lift pin 97 disposed with the lift pin bellows 92. The lift pin 97 may be coupled at its lower end to a drive mechanism (not shown) that may be adapted to controllably drive the lift pin 97 along its axis from a retracted position, wherein a tip of the lift pin 97 is positioned below the chucking surface 14 of the chuck body 12 (as shown in FIG. 6), to an extended position, wherein the tip of the lift pin 97 is positioned a distance above the chucking surface 14. The lift pin 97, and the other lift pins of the assembly 10, may thus be extended and refracted to raise and lower a substrate that is disposed on the chucking surface 14, such as during loading and unloading of a substrate onto and off of the chuck body 12.

The lift pin bellows 92 thus provides a vertical passageway for accommodating extension and retraction of the lift pin 97. Additionally, while an internal volume 100 of the lift pin bellows 92 may be in fluid communication with the vacuum environment 64 via the lift pin aperture 87, the lift pin bellows 92 can provide a fluid-tight barrier between the internal volume 100 and the pocket 62 within the assembly 10. Thus, the lift pin bellows 92 maintains fluid separation between the pocket 62 and the vacuum environment 64, thereby maintaining enhanced, atmospheric heat transfer between the chuck body 12 and the cooling plate 40 as described above.

Referring again to FIG. 1, a plurality of grooves 104 may be formed in the chucking surface 14 of the chuck body 12 and may be configured to distribute a heat transfer gas (also referred to as a "backside gas") from a backside gas outlet 106 in the center of the chuck body 12 to the backside of a substrate disposed on the chucking surface 14. The grooves 104 may be arranged as interconnected, radially extending "spokes" and concentric circles as shown in FIG. 1, but this is not critical. It is contemplated that the chucking surface 14 may additionally or alternatively be provided with various other surface features, including, but not limited to, mesas, channels, and/or additional gas outlets for distributing the backside gas between the chucking surface 14 and a substrate. The backside gas may include Helium (He) or any other non-combustible gas that may enhance heat transfer between the chuck body 12 and a substrate.

Figure 8:
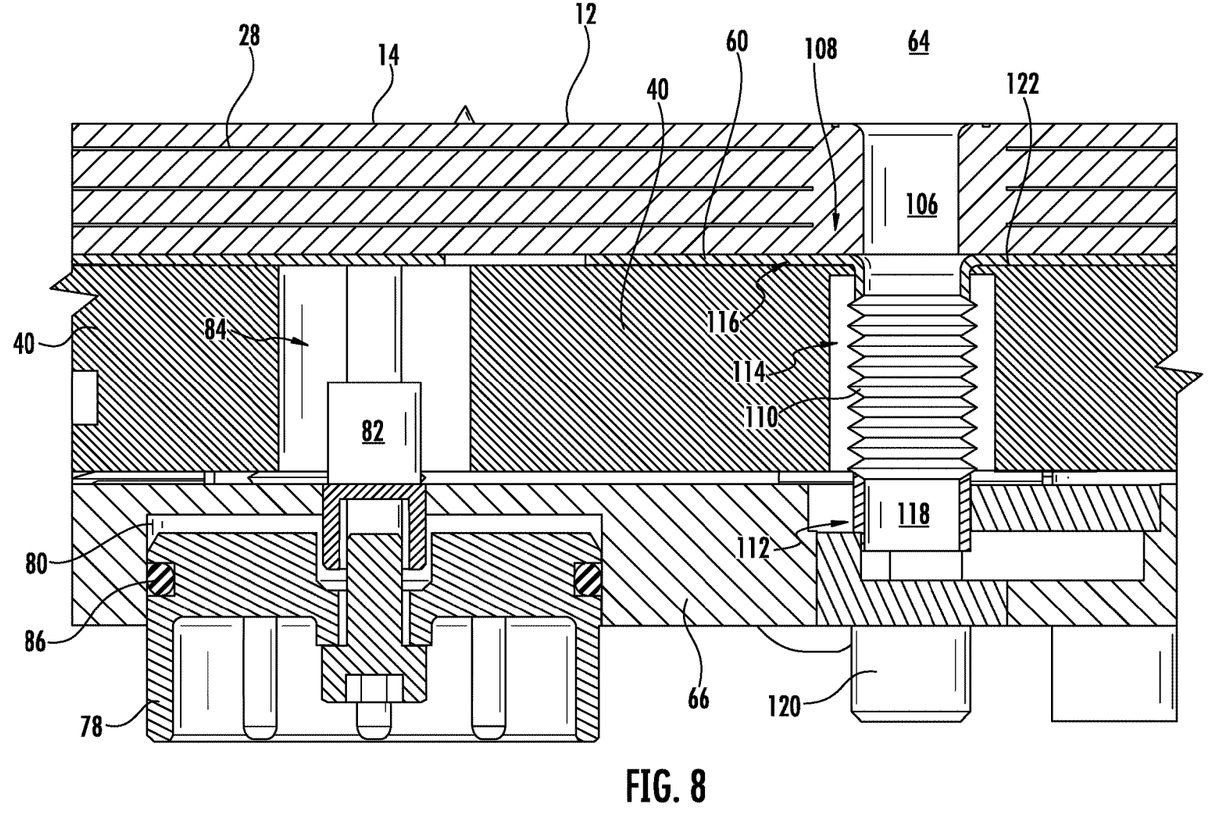
FIG. 8 is a detail cross-sectional view illustrating a backside gas assembly and surrounding components of the exemplary high-temperature electrostatic chuck assembly shown in FIG. 2.

Referring to FIG. 8, a detail cross-sectional view of a backside gas assembly 108 of the assembly 10 is shown. The backside gas assembly 108 may include a backside gas bellows 110 that may extend vertically between interface plate 66 and the chuck body 12 through respective apertures 112, 114, 116 in the interface plate 66, the cooling plate 40, and the heat transfer layer 60, respectively. In one non-limiting example, the backside gas bellows 110 may be formed of stainless steel. A lower portion or edge of the backside gas bellows 110 may be welded or otherwise coupled to the interface plate 66 in a manner that forms a fluid-tight seal there between, and with an internal volume 118 of the backside gas bellows 110 in fluid communication with a backside gas supply line 120 that may be routed through the adapter plate 76. A top edge or portion of the backside gas bellows 110 may be coupled to the chuck body 12 in a manner that forms a fluid-tight seal there between, and with the backside gas bellows 110 disposed in a substantially coaxial relationship with the backside gas outlet 106 in the chuck body 12. In the non-limiting example shown in FIG. 8, the top of the backside gas bellows 110 may be provided with a radially outwardly-extending annular flange 122. The flange 122 may be brazed to the chuck body 12 in a flatly abutting relationship therewith, and may radially surround the lower terminus of the backside gas outlet 106. The backside gas bellows 110 may be capable of axially extending and retracting along a longitudinal axis of the backside gas assembly 108 to accommodate vertical movement of the chuck body 12 relative to the interface plate 66, such as may occur when substrates are loaded and unloaded from the chucking surface 14, while maintaining fluid tight coupling between the interface plate 66 and the chuck body 12.

Thus arranged, the backside gas bellows 110 provides a vertical conduit through which backside gas may flow from the backside gas supply line 120 to the backside gas outlet 106. Additionally, while the internal volume 118 of the backside gas bellows 110 is in fluid communication with the vacuum environment 64 via the backside gas outlet 106, the backside gas bellows 110 provides a fluid-tight barrier between the internal volume 118 and the pocket 62 within the assembly 10. Thus, the backside gas bellows 110 maintains fluidic separation between the pocket 62 and the vacuum environment 64, thereby maintaining enhanced, atmospheric heat transfer between the chuck body 12 and the cooling plate 40 as described above.

Referring again to FIG. 1, The chuck body 12 may further include a plurality of ground pin apertures 130 for allowing vertical pass-through of corresponding ground pins (described below) that may be employed for removing electrical charge from a substrate disposed on the chucking surface 14 as further described below. While the chuck body 12 is shown as having a total of 18 ground pin apertures 130 for accommodating 18 respective ground pins arranged in a circular pattern adjacent a periphery of the chuck body 12, it is contemplated that the chuck body 12 may include a greater or fewer number of ground pin apertures 130 for accommodating a greater or fewer number of respective ground pins arranged in various other patterns without departing from the present disclosure.

Figure 9:
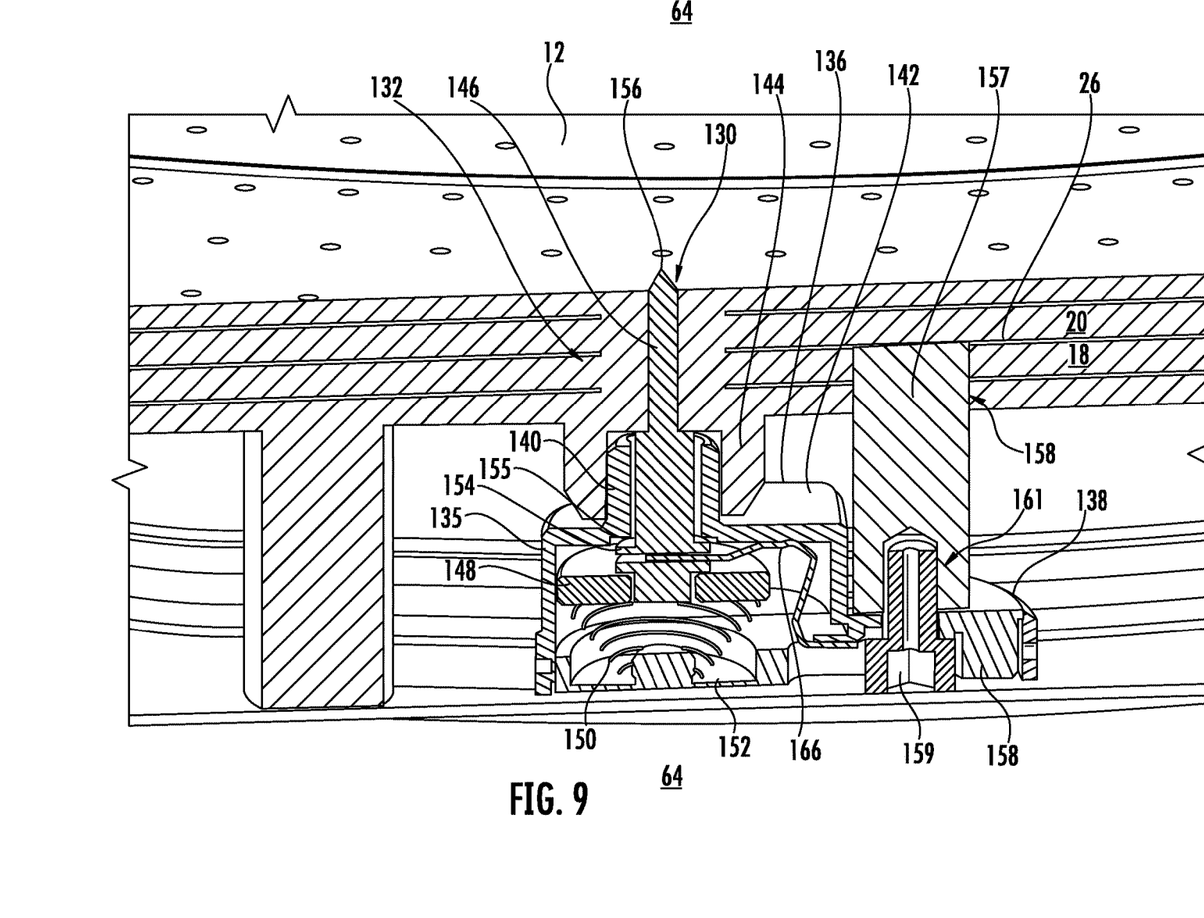
FIG. 9 is a detail cross-sectional view illustrating the ground pin assembly and surrounding components of the exemplary high-temperature electrostatic chuck assembly taken along line C-C in FIG. 1.

Referring to FIG. 9, a detail cross-sectional view of a ground pin assembly 132 of the assembly 10 is shown. Though only one ground pin assembly 132 is shown in FIG. 9, it will be understood that the assembly 10 may include other, substantially identical ground pin assemblies (such as ground pin assembly 134 shown in FIG. 2) located below each of the ground pin apertures 130 shown in FIG. 1. The following description of the ground pin assembly 132 shall therefore also apply to each of the other ground pin assemblies of the assembly 10.

The ground pin assembly 132 may be located radially outside of the sealing ring 68 (FIG. 2) and may include a housing 135. The housing 135 may include a pin enclosure 136 and an adjoining fastening tab 138. The housing 135 may further include a tubular neck portion 140 that may extend vertically from a top 142 of the pin enclosure 136 into an annular cuff 144 that extends from a bottom of the chuck body 12 below the ground pin aperture 130. Arranged thusly, the neck portion 140 of the housing 135 may be disposed in a substantially coaxial relationship with the ground pin aperture 130.

The ground pin assembly 132 may further include an axially displaceable, electrically conductive ground pin 146 that may be disposed within the pin enclosure 136 and that may extend vertically through the neck portion 140 and the ground pin aperture 130. The ground pin may be formed of any suitably rigid, electrically conductive material(s). Non-limiting examples of such materials include aluminum, titanium, molybdenum, tungsten carbide, and diamond-like carbon (DLC) coated aluminum or titanium.

The ground pin 146 may be seated within an axially displaceable, electrically insulating base member 148. A coil spring 150 may be interposed between, and may be coupled to, the base member 148 and a floor 152 of the pin enclosure 136. When there is no substrate disposed on the chuck body 12, the coil spring 150 may bias the base member 148 and the ground pin 146 upwardly so that a shoulder 154 of the ground pin 146 engages a confronting shoulder 155 of the cuff 144, and so that a pointed tip 156 of the ground pin 146 protrudes from the ground pin aperture 130 a distance above the chucking surface 14. When a substrate is loaded onto the chuck body 12, the weight of the substrate may be sufficient to overcome the biasing force of the coil spring 150. Thus, a substrate may be disposed on the chucking surface 14 in substantially flat engagement therewith while the coil spring 150 holds the tip 156 of the ground pin 146 in firm engagement with the substrate to maintain a desired electrical connection there between.

The ground pin assembly 132 may further include a ground electrode 157 that may be mounted within a cavity or socket 158 that extends from the bottom of the chuck body 12 to the grounding circuit 26. The ground electrode may be a generally cylindrical body formed of a rigid, electrically conductive material, such as KOVAR®. In one non-limiting example, the ground electrode 157 may be brazed within the socket 158 (i.e., brazed to the chuck body 12 and the grounding circuit 26) which may firmly secure the ground electrode 157 within the socket 158 and provide a desired electrical connection between the ground electrode 157 and the grounding circuit 26. A conductive fastener 159 (e.g., a bolt) may extend vertically through a floor 160 of the fastening tab 138 and may be fastened to the ground electrode 157, such as through threaded engagement with a threaded recess 161 in a bottom of the ground electrode 157. In one non-limiting embodiment, the conductive fastener 159 may be formed of 440 stainless steel or any other suitable rigid, electrically conductive material.

The conductive fastener 159 may be electrically coupled to the ground pin 146 by an electrical conductor 166 (e.g., an insulated wire) that extends through the housing 135. Arranged thusly, the ground pin 146, the electrical conductor 166, the conductive fastener 159, and the ground electrode 157 may provide a complete electrical pathway between a substrate that is disposed on the chucking surface 14 and the grounding circuit 26. This electrical pathway may be maintained regardless of any vertical movement of the ground pin 146 that may occur as a result of loading or unloading a substrate onto and off of the chuck body 12. Additionally, the electrical pathway may extend between the vacuum environment 64 located radially outside of the sealing ring 68 to the pocket 62 located radially inside of the sealing ring 68 (via the grounding circuit 26) without comprising the separation of the pocket 62 and the vacuum environment 64.

Figures 10A, 10B:
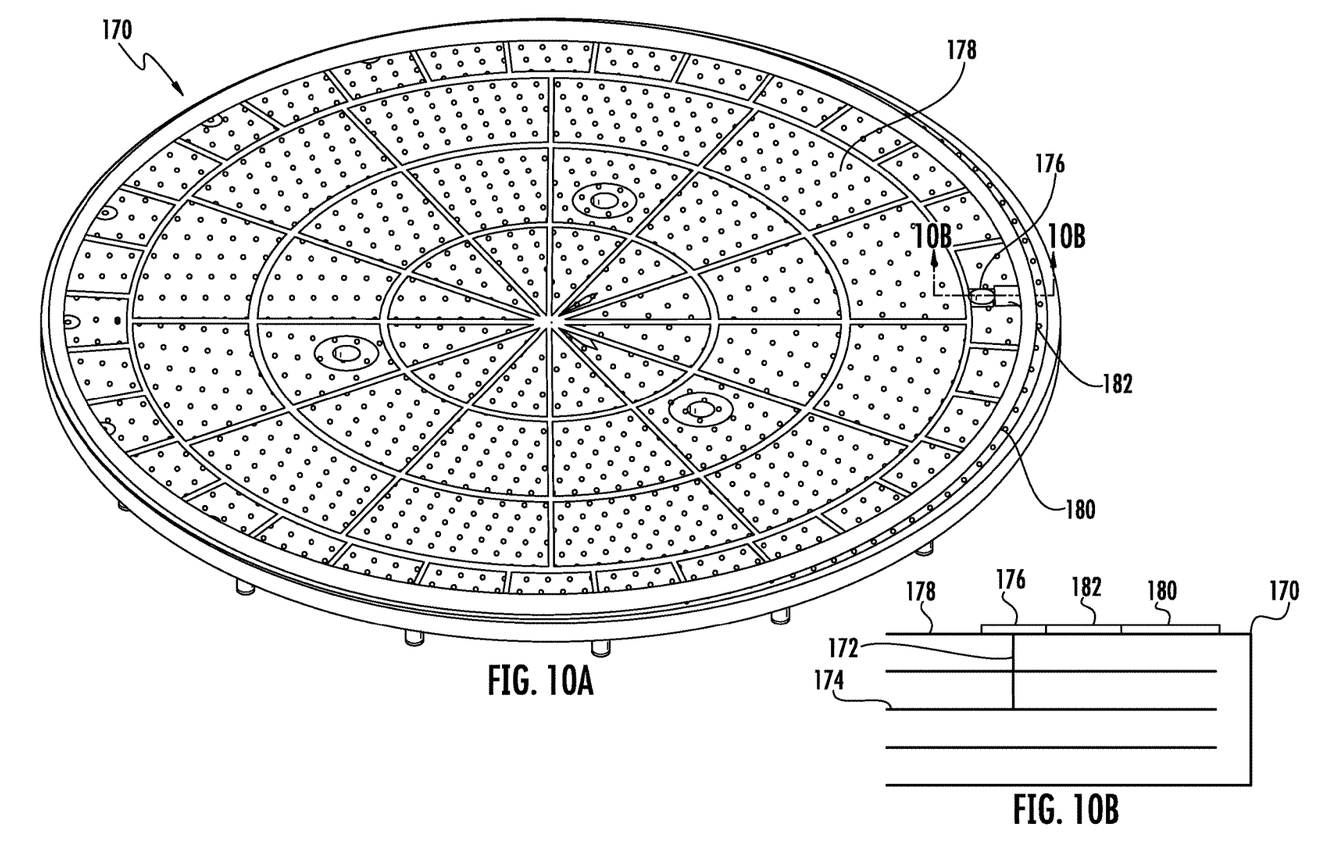
FIG. 10*a* is a top perspective view of an exemplary alternative embodiment of a chuck body in accordance with the present disclosure.
FIG. 10*b* is a detail cross-sectional view illustrating the alternative chuck body shown in FIG. 10*a* taken along line D-D in FIG. 10*a*.

Referring to FIGS. 10a and 10b, a perspective view and a cross-sectional detail view of an alternative chuck body 170 of the device 10 are shown wherein the above-described ground pin assembly 132 (and all of the other ground pin assemblies of the device 10) are omitted. Instead, one or more grounding conductors, such as the grounding conductor 172 shown in FIG. 10b, may be embedded within the chuck body 170 and may extend from an embedded grounding circuit 174 (similar to the grounding circuit 26 described above) to an electrically conductive terminal 176 on a chucking surface 178 of the chuck body 170. A conductive outer sealing ring 180 may be formed or disposed on the chucking surface 178 and may be electrically coupled to the terminal 176, such as via a conductive trace 182. Thus, the conductive outer sealing ring 180, the conductive trace 182, the conductive terminal 176, and the grounding conductor 172 may provide a complete electrical pathway between a substrate that is disposed on the chucking surface 178 and the grounding circuit 174. In one non-limiting embodiment, one or more of the conductive outer sealing ring 180, the conductive trace 182, and the conductive terminal 176 may be formed of a DLC coating on the chucking surface 106, though it is contemplated that any other suitable conductive materials and/or structures may also be used.

Figure 11:
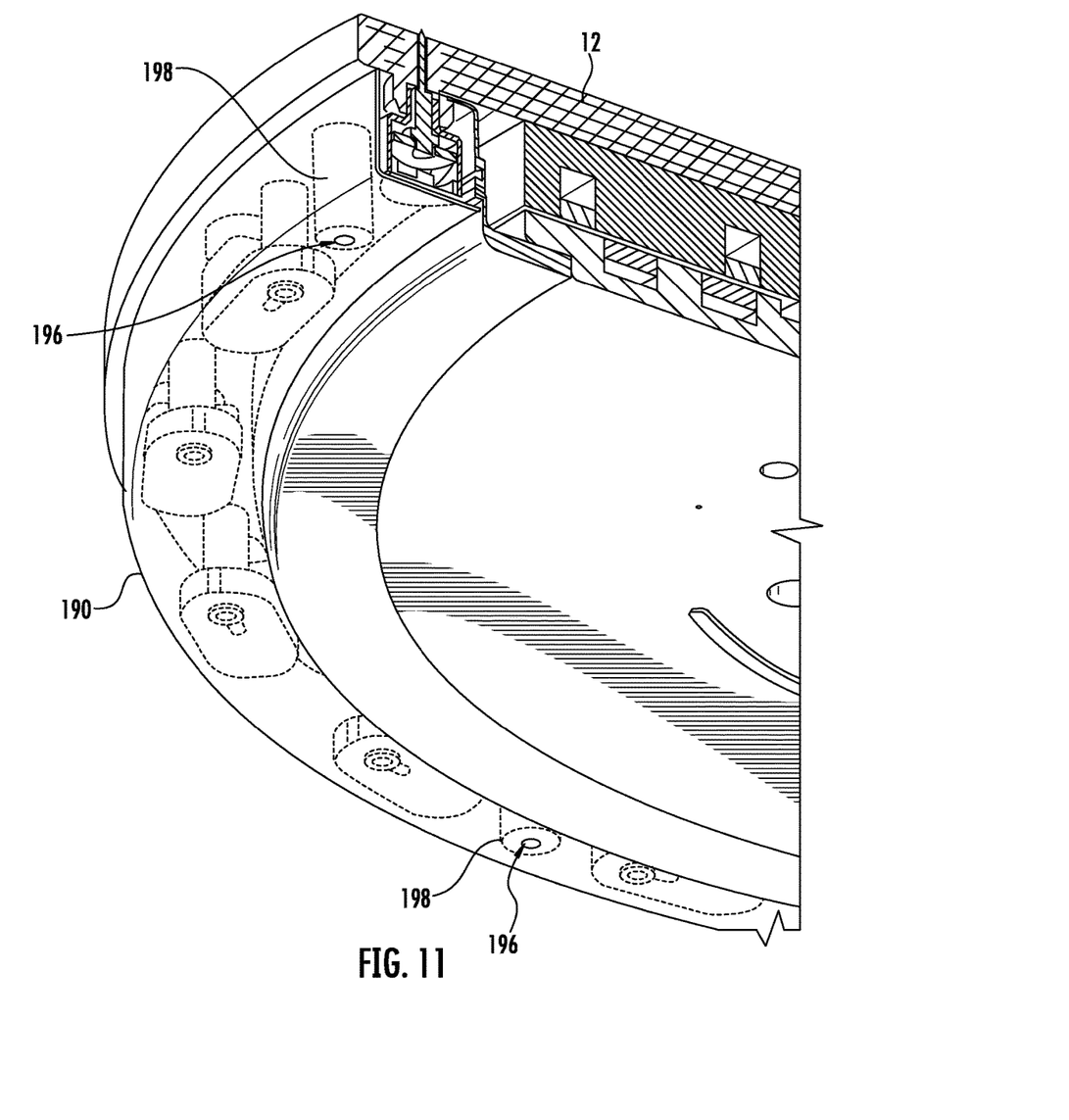
FIG. 11 is a detail bottom perspective view illustrating a ground pin cover and surrounding components of the exemplary high-temperature electrostatic chuck assembly shown in FIG. 1.

Referring again to FIG. 2, the assembly 10 may further include an annular ground pin cover 190 that may fit over a bottom of the ground pin assemblies of the assembly 10. The ground pin cover 190 may have a substantially L-shaped cross-section defining a sidewall 192 and a floor 194. A top edge of the sidewall may vertically abut a bottom surface of the chuck body 12, and a radially inward edge of the floor 194 may radially abut a side surface of the interface plate 66. Referring to FIG. 11, the ground pin cover 190 may be removably secured to the chuck body 12 by a plurality of fasteners (not shown) that may extend through a plurality of circumferentially-spaced apertures 196 in the floor 194 and into secure engagement (e.g., threaded engagement) with respective bosses 198 that may extend from a bottom of the chuck body 12.

The foregoing disclosure thus provides a detachable electrostatic chuck assembly 10 that can be conveniently removed from an adapter plate and that is capable of operating at high temperatures (e.g., up to and exceeding about 450 degrees C.) without undergoing heat-induced component failure. This can be achieved by locating an interface between a chuck body 12 and a cooling plate 40 of the assembly 10 within a pocket 62 separate from the vacuum environment 64. This arrangement can enhance thermal transfer between the chuck body 12 and the cooling plate 40 as compared to prior electrostatic chuck assemblies which have the interface between the chuck body and the cooling plate located within a vacuum environment. As previously noted, the pocket 62 can be maintained by routing lift pins 97 of the assembly 10 through respective lift pin bellows 92 that provide a fluid-tight seal between the pocket 62 and the vacuum environment 64. The pocket 62 may further be preserved by supplying a backside gas to a chucking surface 14 of the assembly 10 through a backside gas bellows 110 that provides a fluid-tight seal between the pocket 62 and the vacuum environment 64. The pocket 62 is further maintained by routing electrical connections between ground pins 146 to a grounding circuit 26 in a manner that maintains fluidic separation between the pocket 62 and the vacuum environment 64.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:
1. An electrostatic chuck assembly comprising:
a chuck body for supporting a substrate;

an interface plate coupled to the chuck body by a sealing ring, the sealing ring defining an enclosed volume disposed entirely on a backside of the chuck body between the chuck body and the interface plate;

a cooling plate disposed between the chuck body and the interface plate, wherein an interface between the chuck body and the cooling plate is located within the enclosed volume; and a lift pin assembly including a lift pin bellows extending through the enclosed volume between the interface plate and a lift pin aperture in the chuck body, and an axially displaceable lift pin disposed within the lift pin bellows, wherein an internal volume of the lift pin bellows is fluidically sealed from the enclosed volume.

2. The electrostatic chuck assembly of claim 1, wherein the enclosed volume is a pocket that is fluidically sealed from a surrounding vacuum environment.

3. The electrostatic chuck assembly of claim 1, further comprising a backside gas assembly including a backside gas bellows extending through the enclosed volume between a backside gas supply line and a backside gas outlet in the chuck body, wherein an internal volume of the backside gas bellows is fluidically sealed from the enclosed volume.

4. The electrostatic chuck assembly of claim 1, further comprising a fluid conduit embedded within the cooling plate and having a fluid inlet port and a fluid outlet port, the fluid conduit configured to circulate a cooling fluid for cooling the cooling plate.

5. The electrostatic chuck assembly of claim 1, further comprising a heat transfer layer disposed between the cooling plate and the chuck body.

6. The electrostatic chuck assembly of claim 5, wherein the heat transfer layer includes at least one of a perfluoroelastomer material and a flexible graphite material.

7. The electrostatic chuck assembly of claim 1, wherein the chuck body includes a pair of flatly abutting layers that are bonded together, and a grounding circuit disposed between the pair of flatly abutting layers.

8. The electrostatic chuck assembly of claim 7, further comprising a ground pin assembly including an electrically conductive, movable ground pin extending through a ground pin aperture in the chuck body, the ground pin being electrically coupled to the grounding circuit.

9. The electrostatic chuck assembly of claim 8, wherein the ground pin is electrically coupled to the grounding circuit via a ground electrode that extends through the chuck body.

10. The electrostatic chuck assembly of claim 7, further comprising an electrically conductive sealing ring on a chucking surface of the chuck body, wherein the electrically conductive sealing ring is electrically connected to the grounding circuit by a grounding conductor that extends through the chuck body.

11. The electrostatic chuck assembly of claim 1, further comprising a supporting ring extending through the cooling plate between the interface plate and the chuck body for limiting displacement of the chuck body relative to the interface plate.

12. An electrostatic chuck assembly comprising:
a chuck body for supporting a substrate;
an interface plate coupled to the chuck body by a sealing ring, the sealing ring defining an enclosed volume disposed entirely on a backside of the chuck body between the chuck body and the interface plate, wherein the enclosed volume is a pocket that is fluidically sealed from a surrounding vacuum environment;

a cooling plate disposed between the chuck body and the interface plate, wherein an interface between the chuck body and the cooling plate is located within the enclosed volume a backside gas assembly including a backside gas bellows extending through the enclosed volume between a backside gas supply line and a backside gas outlet in the chuck body, wherein an internal volume of the backside gas bellows is fluidically sealed from the enclosed volume; and a lift pin assembly including a lift pin bellows extending through the enclosed volume between the interface plate and a lift pin aperature in the chuck body, and an axially displaceable lift pin disposed within the lift pin bellows, wherein an internal volume of the lift pin bellows is fluidically sealed from the enclosed volume.

13. The electrostatic chuck assembly of claim 12, further comprising a fluid conduit embedded within the cooling plate and having a fluid inlet port and a fluid outlet port, the fluid conduit configured to circulate a cooling fluid for cooling the cooling plate.

14. The electrostatic chuck assembly of claim 12, further comprising a heat transfer layer disposed between the cooling plate and the chuck body.

15. The electrostatic chuck assembly of claim 12, wherein the heat transfer layer includes at least one of a perfluoroelastomer material and a flexible graphite material.

16. The electrostatic chuck assembly of claim 12, wherein the chuck body includes a pair of flatly abutting layers that are bonded together, and a grounding circuit disposed between the pair of flatly abutting layers.

17. The electrostatic chuck assembly of claim 16, further comprising a ground pin assembly including an electrically conductive, movable ground pin extending through a ground pin aperture in the chuck body, the ground pin being electrically coupled to the grounding circuit.

18. The electrostatic chuck assembly of claim 17, wherein the ground pin is electrically coupled to the grounding circuit via a ground electrode that extends through the chuck body.

19. The electrostatic chuck assembly of claim 16, further comprising an electrically conductive sealing ring on a chucking surface of the chuck body, wherein the electrically conductive sealing ring is electrically connected to the grounding circuit by a grounding conductor that extends through the chuck body.

20. The electrostatic chuck assembly of claim 12, further comprising a supporting ring extending through the cooling plate between the interface plate and the chuck body for limiting displacement of the chuck body relative to the interface plate.

21. A high-temperature electrostatic chuck assembly comprising:
a chuck body for supporting a substrate;
an interface plate coupled to the chuck body by a sealing ring, the sealing ring defining an enclosed volume disposed entirely on a backside of the chuck body between the chuck body and the interface plate;
a cooling plate disposed between the chuck body and the interface plate, an interface between the chuck body and the cooling plate being located within the enclosed volume;
a lift pin assembly including a lift pin bellows extending through the cooling plate between the interface plate and a lift pin aperture in the chuck body, and further including an axially displaceable lift pin disposed within the lift pin bellows, an internal volume of the lift pin bellows fluidically sealed from the enclosed volume; and a backside gas assembly including a backside gas bellows extending through the cooling plate between a backside gas supply line and a backside gas outlet in the chuck body, wherein an internal volume of the backside gas bellows is fluidically sealed from the enclosed volume.

* * * * *